US009677169B2

(12) United States Patent
Rachbauer et al.

(10) Patent No.: US 9,677,169 B2
(45) Date of Patent: Jun. 13, 2017

(54) ARC-DEPOSITED Al—CR—O COATINGS HAVING ENCHANCED COATING PROPERTIES

(71) Applicant: Oerlikon Surface Solutions AG, Trubbach, Trubbach (CH)

(72) Inventors: Richard Rachbauer, Feldkirch (AT); Jurgen Ramm, Maienfeld (CH); Joerg Paulitsch, Leoben (AT); Paul Heinz Mayrhofer, Neckenmarkt (AT)

(73) Assignee: OERLIKON SURFACE SOLUTIONS AG, PFÄFFIKON, Pfäffikon (CH)

( * ) Notice: Subject to any disclaimer, the term of this patent is extended or adjusted under 35 U.S.C. 154(b) by 71 days.

(21) Appl. No.: 14/395,897

(22) PCT Filed: Apr. 22, 2013

(86) PCT No.: PCT/EP2013/001188
§ 371 (c)(1),
(2) Date: Oct. 21, 2014

(87) PCT Pub. No.: WO2013/159893
PCT Pub. Date: Oct. 31, 2013

(65) Prior Publication Data
US 2015/0111795 A1   Apr. 23, 2015

(30) Foreign Application Priority Data

Apr. 22, 2012   (EP) .................................... 12002815

(51) Int. Cl.
*C23C 14/32*   (2006.01)
*C10M 103/06*   (2006.01)
(Continued)

(52) U.S. Cl.
CPC .............. *C23C 14/325* (2013.01); *C09D 1/00* (2013.01); *C09D 5/084* (2013.01);
(Continued)

(58) Field of Classification Search
CPC ... C23C 14/325; C23C 14/08; C23C 14/0021; C23C 14/081; C23C 14/083; C09D 1/00;
(Continued)

(56) References Cited

U.S. PATENT DOCUMENTS 6,602,390 B1 *   8/2003   Brandle ................ C23C 14/325
                                              118/723 VE
2008/0090099 A1    4/2008   Ramm
2009/0252973 A1 * 10/2009   Cremer ............... C23C 14/0641
                                                     428/446

FOREIGN PATENT DOCUMENTS

JP       2011-152627 A       8/2011
JP       2011152627 A    *   8/2011

OTHER PUBLICATIONS

International Search Report for PCT/EP2013/001188 dated Jun. 28, 2013.

* cited by examiner

*Primary Examiner* — James Goloboy
(74) *Attorney, Agent, or Firm* — Pearne & Gordon LLP (57) ABSTRACT

The present invention relates to a method for coating Al-Cr-0 coatings with the help of a PVD-coating process. The PVD-coating process is performed with the help of Al and Cr comprising targets which are doped with Si. The doping of Si prevents the forming of oxide islands on the target during the reactive coating process.

7 Claims, 4 Drawing Sheets

(51) Int. Cl.
*C09D 1/00* (2006.01)
*C23C 14/08* (2006.01)
*C09D 5/08* (2006.01)
*C23C 14/00* (2006.01)

(52) U.S. Cl.
CPC ....... *C10M 103/06* (2013.01); *C23C 14/0021* (2013.01); *C23C 14/08* (2013.01); *C23C 14/081* (2013.01); *C23C 14/083* (2013.01); *C10M 2201/0863* (2013.01); *C10M 2201/1006* (2013.01)

(58) Field of Classification Search
CPC ................ C09D 4/084; C10M 103/06; C10M 2201/0863; C10M 2201/1006
USPC ...................... 508/107; 204/192.38; 427/580
See application file for complete search history.

ARC-DEPOSITED Al—Cr—O COATINGS HAVING ENCHANCED COATING PROPERTIES

The present invention relates to ternary aluminum chromium oxide coatings (Al—Cr—O) which can contain additionally Al—O phases. The coatings are deposited according to the present invention from composite targets comprising aluminum and chromium, preferentially, but not exclusively, by means of reactive cathodic arc PVD techniques, The coatings according to the present invention exhibit enhanced coating properties, particularly concerning corrosion resistance, oxidation resistance, mechanical properties and chemical stability. Furthermore, the present invention relates to a method for industrial manufacturing of the Al—Cr—O coatings which allows adjusting coating properties by addition of small amounts of other elements to the Al—Cr targets used as coating material source.

STATE OF THE ART

Crystalline Al—Cr—O coatings are very promising because of their outstanding properties. It is specially desired to produce crystalline $(Al,Cr)_2O_3$ coatings in solid solutions having a predominantly corundum structure or containing a corundum structure because of the better chemical, mechanical and tribological properties associated to this kind of crystalline structure. A deposition method to produce $(Al,Cr)_2O_3$ layers from Al—Cr alloyed targets, which are evaporated in an oxygen comprising environment by means of reactive cathodic arc-evaporation is proposed by Ramm et al in US20070000772A1.

Furthermore, Ramm at al reported in Surface & Coatings Technology 202 (2007) 876-883 "Pulse enhanced electron emission (P3eTM) arc evaporation and the synthesis of wear resistant Al—Cr—O coatings in corundum structure" that the utilization of composite targets for the synthesis of ternary and higher oxides by reactive arc evaporation is very efficient. Thus the metallic composition of the oxides is controlled by the target composition in a wide process window. It was also mentioned that the oxide synthesis proceeds in pure oxygen environment.

Limitations of the State of the Art for the Deposition of Al—Cr—O Layers from Al—Cr Alloyed Targets by Reactive Cathodic Arc PVD Processes Nevertheless, Ramm et al reported in Surface & Coatings Technology 205 (2010) 1356-1361 "Correlation between target surface and layer nucleation in the synthesis of Al—Cr—O coatings deposited by reactive cathodic arc evaporation" that the operation of Al-comprising composite targets in a pure oxygen atmosphere may have the disadvantage that oxide containing materials can grow at the target surface during the evaporation process. This oxide material observed at the target surface exposed to the oxygen atmosphere is commonly referred to as "oxide island". Ramm et al attributed the observed "oxide island" growth to the oxidation of excess aluminum which is produced during the melting-quenching processes which take place at the target surface during evaporation.

A possible explanation of the appearance of the oxide islands at the target surface given by Ramm et al is that at least some aluminum comprised in the composite target of the given Al—Cr composition is not consumed by forming high melting point intermetallic compounds. This excess aluminum, if it is set free at temperatures above 1000° C. can react with the available oxygen and form at this high temperature the oxide islands which exhibit at least partially corundum structure.

For preventing or avoiding formation of oxide islands at the target surface, one may discuss two solutions:

1) One possibility is to select the composition of the aluminum comprising composite target so that the separation of the precipitation of the metallic aluminum phase during the melting-quenching process at the target surface (during evaporation by the cathodic arc) occurs at a temperature below to 1000° C. This is for instance the case when targets with element composition $Al_{85}Cr_{15}$ in atomic percent are used.
2) The other possibility is to select the composition of the aluminum comprising composite target so that only the formation of intermetallic compounds for the selected composition is possible.

However, non of these two approaches can be applied for the Al—Cr material system if it is desired to synthetize a ternary oxide with corundum structure. It was mentioned in the publication of Ramm et al (published in 2007 as mentioned above) that only for Al-amounts of less than 70 at. % in the layer or target, respectively, the corundum structure for the Al—Cr—O could be identified by XRD analysis. Therefore, a strategy to increase the Al-content above 85 at. % would indeed prevent oxide island growth, however, it would prevent the formation of the Al—Cr—O solid solution in corundum structure.

Objective of the Invention

It is an objective of the present invention to provide an arc-evaporation PVD method for the industrial synthesis of Al—Cr—O coatings which does not have the disadvantages as mentioned above.

In particular, it is an objective of the invention to prevent the oxide island growth at the surface of Al—Cr targets during cathodic arc evaporation in oxygen atmosphere.

Another objective of the invention is to produce coatings with dense morphology by arc evaporation deposition inclusively at high oxygen flows.

An additional objective of the invention is to form crystalline phases in the Al—Cr—O coating in addition or as replacement of the Al—Cr—O solid solution in corundum structure.

DESCRIPTION OF THE INVENTION

In order to overcome the disadvantages as mentioned before, the inventors decided to use Al—Cr containing composite targets comprising an additional element with the intention to study its influence on oxide island growth and with the objective to prevent or influence this oxide island growth at the target surface.

Surprisingly, doping the Al—Cr comprising targets with small amounts of silicon (Si) for producing for example Al—Cr—Si targets having an element composition in atomic percent of $Al_{70}Cr_{25}Si_5$, no more oxide islands growth was detected after target operation by reactive cathodic arc-evaporation processes, inclusively at very high oxygen flows (about 800 sccm and more) and for extended durations of arc operation.

For a better understanding of the present invention, some further details will be described using the FIGS. 1 to 4.

Figure 1:
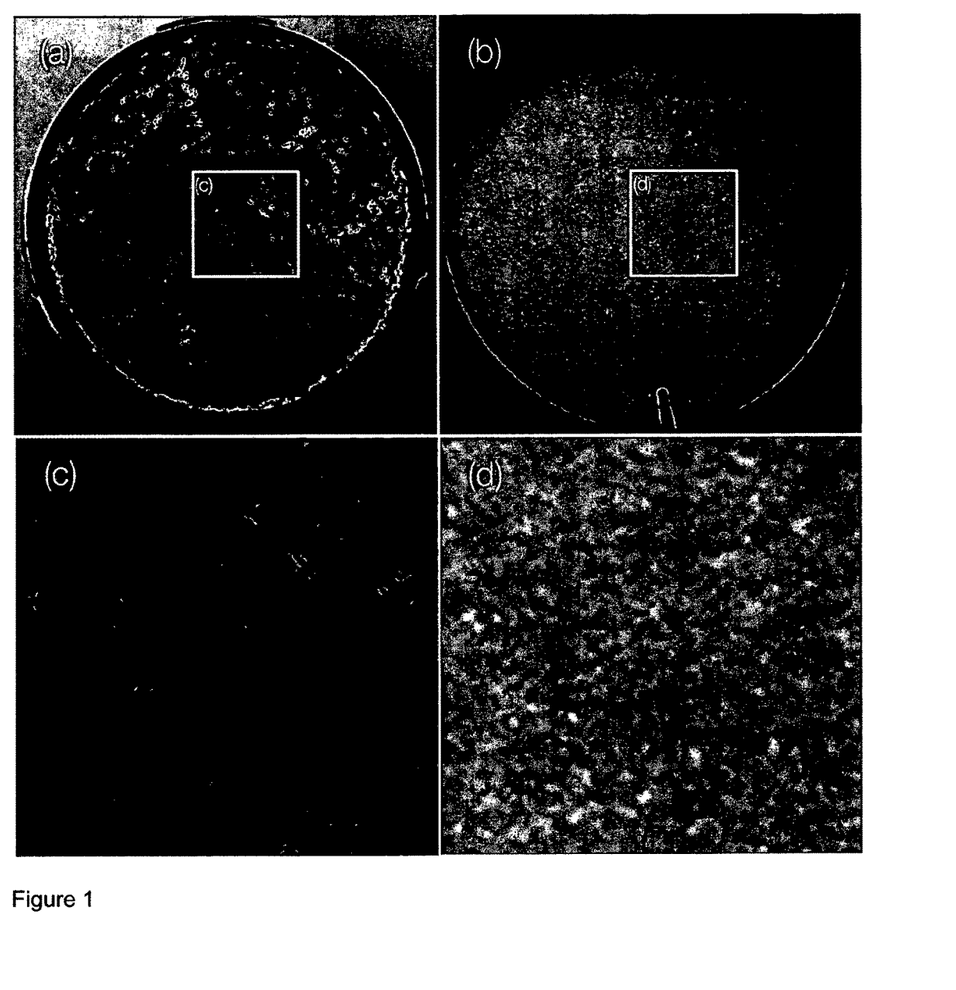
FIG. 1: Photos of two surfaces corresponding to two different targets operated by reactive cathodic arc-evaporation a) Photo of the surface of an $Al_{70}Cr_{30}$ target which was operated for 1.5 h in a pure oxygen atmosphere at a flow of 800 sccm oxygen.
b) Photo of the surface of an $Al_{70}Cr_{25}Si_5$ target which was operated for 1.5 h in a pure oxygen atmosphere at a flow of 800 sccm oxygen.
c) Image magnification of the target surface showed in FIG. 1a.
d) Image magnification of the target surface showed in FIG. 1b.
Figure 2:
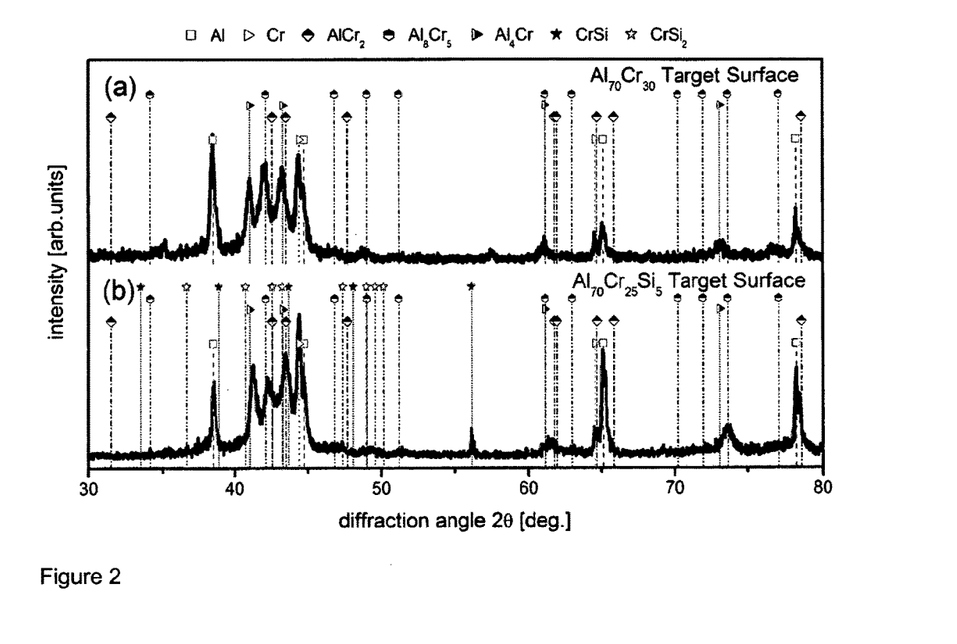
FIG. 2: XRD spectra of the surfaces of the both targets showed in FIG. 1
a) $Al_{70}Cr_{30}$ target
b) $Al_{70}Cr_{25}Si_5$ target

In FIG. 1a, the presence of many black dots at the surface of the $Al_{70}Cr_{30}$ target can be observed, these black dots are oxide islands containing some amount of corundum structured $Al_2O_3$ (as identified by XRD). While in FIG. 1b, it can be observed that the surface of the $Al_{70}Cr_{25}Si_5$ target is free of black dots. The surfaces of the both targets $Al_{70}Cr_{30}$ and $Al_{70}Cr_{25}Si_5$ were analyzed by X-ray diffraction analysis in order to identify the phases present at the target surface for both target materials. The XRD spectra obtained from the target surfaces are shown in FIG. 2. The analysis of the target surface of the $Al_{70}Cr_{30}$ (FIG. 2a) is consistent with previous investigations and shows besides the formation of Al and Cr phases also the formation of $Al_8Cr_5$ and $Al_4Cr$ phases. The analysis of the $Al_{70}Cr_{25}Si_5$ target (FIG. 2b) shows similarly as in FIG. 2a the formation of Al and Cr phases as well as $Al_8Cr_5$ and $Al_4Cr$ phases, but in this case, the $Al_8Cr_5$ and $Al_4Cr$ peaks are shifted to higher diffraction angles. This may be explained by the incorporation of Si in these phases and additionally the possible presence of a CrSi phase can be observed.

An embodiment of the present invention relates to a reactive cathodic arc-evaporation coating method for producing Al—Cr—O using Al—Cr targets (as source coating material) which are doped with silicon. The Al—Cr—Si targets having preferably following element composition in atomic percent:

Thus it is possible to reduce or prevent the growth of oxide islands by the evaporation of the targets in pure oxygen atmosphere or in gas mixtures containing oxygen, inclusively using high oxygen flows.

Within the description of the present invention flowing flows and pressures will be considered as low, middle or high flows:
Low oxygen flows: about 100 to 250 sccm (200 sccm~0.3 Pa in coating chamber)
Middle oxygen flows: about 250 to 500 sccm
High oxygen flows: about 800 to 1000 sccm (~>=2.3 Pa in coating chamber)

Doping the target with e.g. 5 at. % Si changes the Al/Cr ratio compared to the Al70Cr30 target from 2.3 to 2.8 which in turn would be comparable to an Al(74)Cr(26) target composition for an un-doped target. Based on previous investigations (Ramm et al 2007) one would expect that the metallic target composition would be reproduced in the metallic composition of the synthesized ternary oxide. This is not the case. The Al/Cr ratio in the synthesized coating is shifted to higher Al ratios for both target compositions. In Table 1, the compositions of the Al/Cr ratios for the synthesized Al—Cr—O coatings are displayed.

TABLE 1

Element composition of two different coatings produced by reactive cathodic arc-evaporation from respectively $Al_{70}Cr_{30}$ and $Al_{70}Cr_{25}Si_5$ targets by EDX and ERDA

| Target | Coating element composition measured by EDX [at. %] | | | Coating element composition measured by ERDA [at. %] | | |
|---|---|---|---|---|---|---|
| | Al | Cr | O | Al | Cr | O |
| $Al_{70}Cr_{30}$ | | | | 29.5 | 10.9 | 58.6 |
| $Al_{70}Cr_{25}Si_5$ | 30.92 | 11.11 | 57.97 | 30.3 | 9.7 | 59.4 |
| | 31.38 | 10.89 | 57.73 | | | |
| | 31.97 | 10.93 | 57.10 | | | |

The compositions were measured by two independent analysis methods: Energy Dispersive X-ray Spectroscopy (EDX) and Elastic Recoil Detection Analysis (ERDA). The modified Al/Cr ratio which results from doping with Si, however, is reflected to some degree in the coating composition. It was, however, completely unexpected that no Si could be detected in the coating which was synthesized from the target with the composition of Al70Cr25Si5. This effect could be explained by a volatilization of the Si in combination with oxygen. In the publication of Shyklaev et al "Initial reactive sticking coefficient of $O_2$ on Si(111)-7×7 at elevated temperatures", Surface Science 351 (1996) 64-74, reactions are described which indicate this effect. However, the conditions which are described in this publication are somewhat different from the conditions under which the oxide synthesis was performed for this work. Therefore, the explanation of the fact that no Si can be found in the oxide coating is an assumption only. Surprisingly is the fact that no or nearly no Si is incorporated in the coating.

The present invention allows the utilization of Al—Cr targets with silicon doping with the advantage that no oxide islands are formed at the target surface and the synthesis of pure Al—Cr oxides without essential Si doping of the coating.

Figure 3:
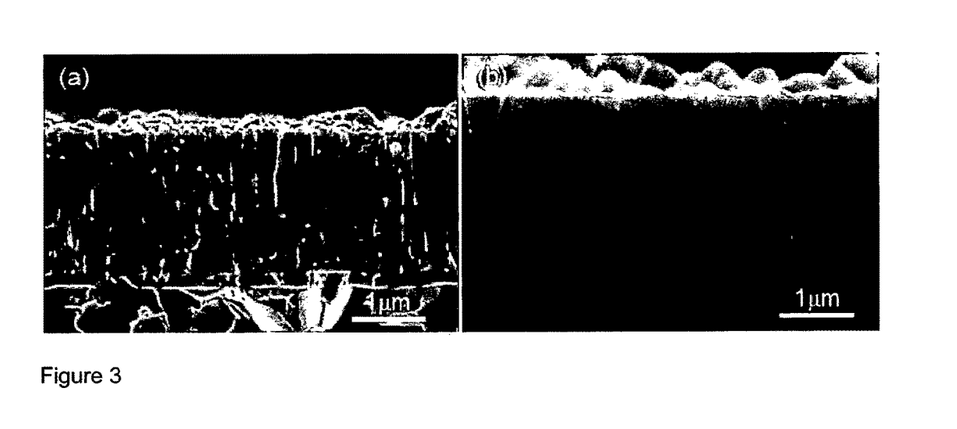
FIG. 3: SEM-micrographs of the fracture morphology of two coatings deposited by reactive cathodic arc evaporation in a pure oxygen atmosphere
a) from a $Al_{70}Cr_{30}$ target at an oxygen flow of 800 sccm
b) from a $Al_{70}Cr_{25}Si_5$ target at an oxygen flow of 800 sccm

In FIGS. 3a and b, the morphology of the synthesized oxide coatings obtained for different target compositions is compared by cross sectional scanning electron microscopy (X-SEM). The morphology of the oxide layer obtained from the $Al_{70}Cr_{30}$ target (a) shows distinctive columnar structure. Based on the existing knowledge, this is a typical behaviour for Al—Cr—O coating materials produced by reactive arc evaporation: increasing oxygen flow results in a pronounced change of the morphology from dense structure (obtained by using low oxygen flows) to columnar growth (obtained by using higher oxygen flows). FIG. 3b was prepared from the coating obtained with the same high oxygen flow (800 sccm) and under identical process conditions, with the exception that the $Al_{70}Cr_{25}Si_5$ target was utilized. The micrograph shows a completely different morphology characterized by a very dense structure. Facing the fact that the coating does not contain Si, this is a completely unexpected result. This dense layer growth, however, makes arc evaporated Al—Cr oxides suitable for oxidation and corrosion resistant coatings for which diffusion processes must be inhibited for and for which the columnar structure would be too leaky. Additional experiments with Si doping of A-Cr targets showed that an addition of Si between 1 and 20 at. % result in similar densifications of the A-Cr oxide coatings, with a preference of Si doping in the range of 2 to 10 at. %.

Although no or negligible (compared to target composition) Si can be found in the synthesized oxide coating, Si doping of the target results in a completely modified morphology of the oxide coating which is characterized by a dense structure without columnar growth and despite the high oxygen flows utilized for the synthesis.

Figure 4:
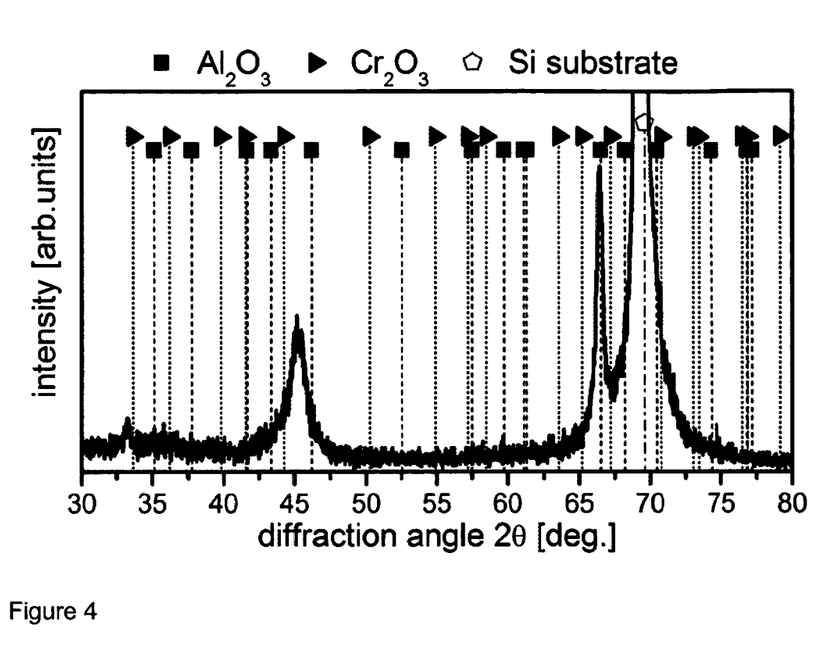
FIG. 4: XRD spectra of the coating deposited from a $Al_{70}Cr_{25}Si_5$ target at an oxygen flow of 800 sccm for which the fracture morphology is shown in the FIG. 3b FIG. 5: XRD spectra of the coating at different Si concentrations.

The XRD analysis of the layer synthesized from the $Al_{70}Cr_{25}Si_5$ target at a oxygen flow of 800 scm (FIG. 4) showed a distinctive peak near 2theta=46°. This peak is attributed to the cubic phase of A-Cr—O in accordance with a publication of Khatibi et al "Phase transformations in face centered cubic (Al0.23Cr0.68)2O3 thin films", Surface & Coating technology 206 (2012) 3216-3222. Although, electron diffraction indicates also additions of the Al—Cr—O solid solutions in corundum structure, for the high oxygen flow, the cubic structure is more pronounced. Oxygen flow and the Al/Cr ratio can be, however, adjusted to leverage the amount of cubic to corundum phase in the A-Cr—O. The XRD analysis shows additional peaks. The peak with the highest intensity near 69° is attributed to the silicon substrate. The additional peak with high intensity near 67° is characteristic for $Al_2O_3$ in corundum structure or alpha alumina. Therefore, doping the target with Si supports the growth of cubic Al—Cr—O phases in the coating and may additionally also produce pure corundum phases.

Figure 5:
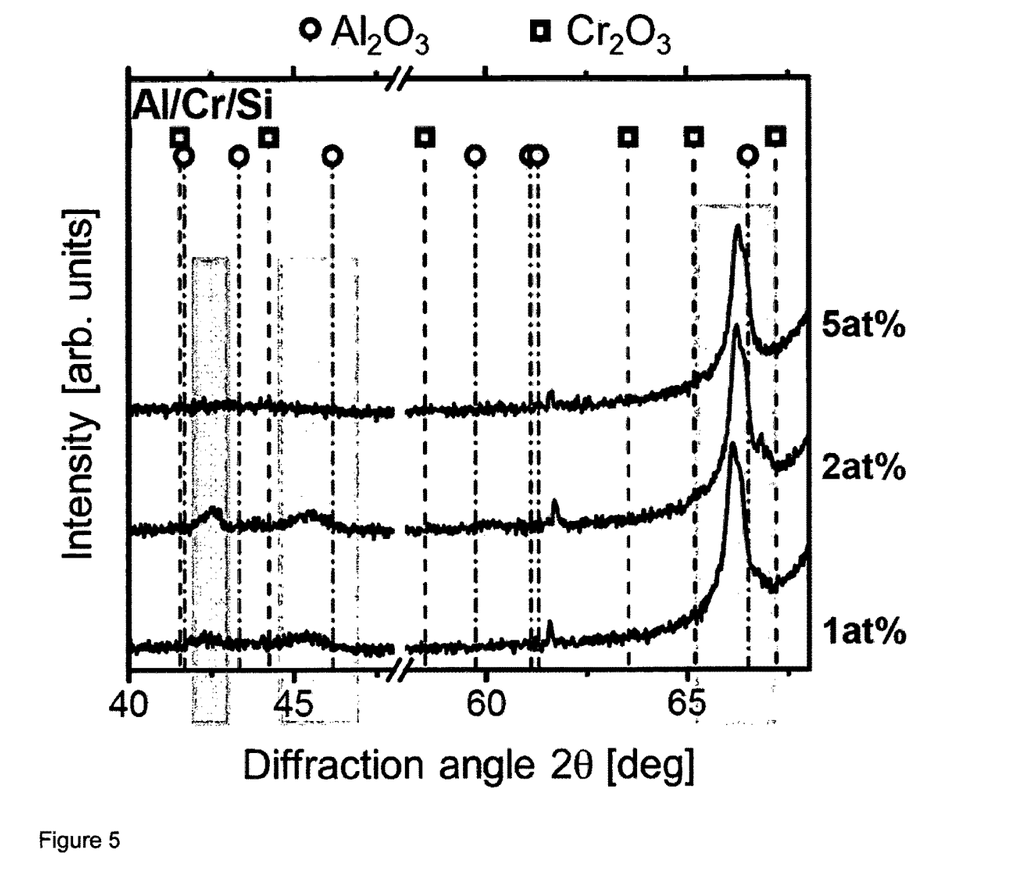

Recommended applications of the coating produced according to the present invention are:
Corrosion resistant coatings
Oxidation barriers
Chemical barriers
Running in layers for high temperature tribological applications
Fuel cell applications
Solid lubricant for high temperature tribology A further very interesting aspect of the present invention is that by using Si doped Al—Cr targets as coating material source for the deposition of Al—Cr—O coatings in an oxygen comprising environment by means of reactive cathodic arc evaporation PVD processes, the formation of the cubic phase of the Al—Cr—O in the coating when the Si concentration in the AlCrSi target is about 5 at. % cannot be detected by X-ray examinations as it is shown in the FIG. 5.

Furthermore, a considerable reduction of the formation of oxide islands at the target surface was also observed when the Si concentration in the AlCrSi targets was about 5 at %

Particular details of the present invention are mentioned in the following claims 1 to 14.

This description discloses a method for producing PVD-oxide-coatings with at least one layer consisting essentially of Al, Cr, Si and O, the method comprising at least the following steps:
a) providing a PVD-coating chamber
b) loading in such PVD-coating chamber substrates having at least one surface to be coated
c) performing a reactive PVD coating process wherein the process gas contains a reactive gas with reacts with metal ions produced from one or more targets for depositing the at least one layer consisting essentially of Al, Cr, Si and O on the substrate surface, characterized in that, the one or more targets used for performing the reactive PVD coating process in step c) have an element composition in atomic percent given by the formula: $Al_{1-x-y}Cr_xSi_y$ with $0.05 \leq y \leq 0.10$ and $0.20 \leq x \leq 0.25$ and the reactive gas is oxygen thereby producing a coating with at least one layer consisting essentially of Al, Cr, Si and O, wherein, if oxygen is not taken into account, in the at least one layer the silicon concentration is less than the silicon concentration in the one or more targets.

The PVD coating process is for example an arc evaporation process.

According to one embodiment of the processing gas comprises essentially only oxygen. It is possible and preferable to choose y=0.05 and x=0.25.

The silicon concentration may be equal or less than half of the silicon concentration in the one or more targets The method may be used to produce a coating system. A substrate can be coated with the coating system The coating system can be used for improving the corrosion resistance.

The coating system can be used as
oxidation barrier, and/or
chemical barrier, and/or
running in layer for high temperature tribological applications, for example above 200° C., and/or
fuel cells, and/or
solid lubricant for tribological applications performed at temperatures higher than 200° C.

The coating system as described above may be applied on a substrate to be used in an application requiring one or more of the above described characteristics.

What is claimed is:

1. Method for producing PVD-oxide-coatings with at least one layer consisting essentially of Al, Cr, Si and O, the method comprising at least the following steps:
    a) providing a PVD-coating chamber,
    b) loading in the PVD-coating chamber substrates having at least one surface to be coated, and
    c) performing a reactive PVD coating process using a process gas containing a reactive gas that reacts with metal ions produced from one or more targets for depositing the at least one layer consisting essentially of Al, Cr, Si and O on the substrate surface,
    characterized in that, the one or more targets used for performing the reactive PVD coating process in step c) have an element composition in atomic percent given by the formula: $Al_{1-x-y}Cr_xSi_y$ with $0.05 \leq y \leq 0.10$ and $0.20 \leq x \leq 0.25$ and the reactive gas is oxygen thereby producing a coating with the at least one layer consisting essentially of Al, Cr, Si and O, wherein, if oxygen is not taken into account, in the at least one layer the silicon concentration is less than the silicon concentration in the one or more targets, and
    the PVD coating process is an arc evaporation process.

2. Method according to claim 1 characterized in that the process gas comprises essentially only oxygen.

3. Method according to claim 1 characterized in that y=0.05 and x=0.25.

4. Method according to claim 1 characterized in that wherein, if oxygen is not taken into account, in the at least one layer the silicon concentration is equal or less than half of the silicon concentration in the one or more targets.

5. Method according to claim 1, wherein the coating forms an oxidation barrier.

6. Method according to claim 1, wherein the coating forms a chemical barrier.

7. Method according to claim 1, wherein the coating is used as a solid lubricant for tribological applications performed at temperatures higher than 200° C.

* * * * *

UNITED STATES PATENT AND TRADEMARK OFFICE
CERTIFICATE OF CORRECTION

PATENT NO. : 9,677,169 B2
APPLICATION NO. : 14/395897
DATED : June 13, 2017
INVENTOR(S) : Richard Rachbauer et al.

Page 1 of 1

It is certified that error appears in the above-identified patent and that said Letters Patent is hereby corrected as shown below:

On the Title Page

Item [54], replace "ARC-DEPOSITED AI-CR-O COATINGS HAVING ENHANCED COATING PROPERTIES" with -- ARC-DEPOSITED AL-CR-O COATINGS HAVING ENHANCED COATING PROPERTIES --.

Signed and Sealed this
Twenty-fourth Day of October, 2017

Joseph Matal
*Performing the Functions and Duties of the
Under Secretary of Commerce for Intellectual Property and
Director of the United States Patent and Trademark Office*